US012812785B2

(12) United States Patent
Liu et al.

(10) Patent No.: US 12,812,785 B2
(45) Date of Patent: Nov. 24, 2026

(54) ELECTRICAL CONNECTION STRUCTURE AND ELECTRONIC DEVICE

(71) Applicant: InnoLux Corporation, Miao-Li County (TW)

(72) Inventors: Chia-Chun Liu, Miao-Li County (TW); Hao-Jung Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 474 days.

(21) Appl. No.: 18/227,285

(22) Filed: Jul. 27, 2023

(65) Prior Publication Data

US 2024/0072459 A1 Feb. 29, 2024

Related U.S. Application Data

(60) Provisional application No. 63/402,478, filed on Aug. 31, 2022.

(30) Foreign Application Priority Data

May 31, 2023 (CN) ......................... 202310627045.0

(51) Int. Cl.
*H05K 1/14* (2006.01)
*H05K 1/11* (2006.01)

(52) U.S. Cl.
CPC ............. *H05K 1/144* (2013.01); *H05K 1/115* (2013.01); *H05K 1/116* (2013.01); *H05K 2201/041* (2013.01); *H05K 2201/0979* (2013.01)

(58) Field of Classification Search
CPC ........ H05K 1/115; H05K 1/116; H05K 1/144; H05K 2201/0979; H05K 2201/09618; H05K 2201/09563; H05K 2201/09627; H05K 2201/041
See application file for complete search history.

(56) References Cited

U.S. PATENT DOCUMENTS 6,521,845 B1 * 2/2003 Barrow ................ H05K 1/0207 174/262
2011/0079919 A1 4/2011 Chaabouni
2021/0092845 A1 * 3/2021 Rothenbuhler ........ H05K 1/116
2022/0272837 A1 * 8/2022 Kato .................... H05K 1/0206
2022/0361330 A1 * 11/2022 Oyaizu .................. H05K 1/113
2023/0134317 A1 * 5/2023 Huang ................ H10W 70/611 257/774
2025/0380362 A1 * 12/2025 Bigl ....................... H05K 1/144

FOREIGN PATENT DOCUMENTS

CN 116072649 A 5/2023

* cited by examiner

*Primary Examiner* — Paresh Paghadal
(74) *Attorney, Agent, or Firm* — Winston Hsu

(57) ABSTRACT

An electrical connection structure including a first substrate, a first conductive pad, a second substrate, a second conductive pad, at least two through holes and a conductive material. The first conductive pad is disposed on the first substrate and includes a first top surface. The second conductive pad is disposed on the second substrate and includes a second top surface. The at least two through holes pass through the first substrate and expose portions of the second top surface. A portion of the conductive material is disposed within the at least two through holes, and the conductive material electrically connects the first conductive pad and the second conductive pad.

13 Claims, 7 Drawing Sheets

ELECTRICAL CONNECTION STRUCTURE AND ELECTRONIC DEVICE

CROSS REFERENCE TO RELATED APPLICATION

This application claims the benefit of U.S. Provisional Application No. 63/402,478, filed on Aug. 31, 2022. The content of the application is incorporated herein by reference.

BACKGROUND OF THE DISCLOSURE

1. Field of the Disclosure

The present disclosure relates to a connection structure and related electronic device, and more particularly to an electrical connection structure and related electronic device.

2. Description of the Prior Art

With the continuous expansion of the application of electronic devices and the rapid development of technology, the requirements for the electrical connection structure and performance of electronic devices are getting higher and higher, which brings different problems for the electronic devices face, such as poor electrical connection effect, conductive layer pollution and other issues. Although the prior art provides to adopt multiple wires for connecting multiple electrical connection structures in series, this design needs to occupy more space, which affects product design and is not easy to implement. Therefore, the research and development of electronic devices need to be continuously carried out and modulated.

SUMMARY OF THE DISCLOSURE

One of the objectives of the present disclosure is to provide an electrical connection structure and related electronic device, wherein a design with two or more holes and a conductive material filling in the holes are adopted in the electrical connection structure for electrically connecting different conductive layers, which can provide multiple insurance for the electrically connection without occupying more arrangement space of elements.

An embodiment of the present disclosure provides an electrical connection structure including a first substrate, a first conductive pad, a second substrate, a second conductive pad, at least two through holes and a conductive material. The first conductive pad is disposed on the first substrate and includes a first top surface. The second conductive pad is disposed on the second substrate and includes a second top surface. The at least two through holes pass through the first substrate and expose portions of the second top surface. A portion of the conductive material is disposed within the at least two through holes, and the conductive material electrically connects the first conductive pad and the second conductive pad.

Another embodiment of the present disclosure provides an electronic device including a first substrate, a first conductive pad, a second substrate, a second conductive pad, at least two through holes, a conductive material, a third substrate, a third conductive pad and another conductive material. The first conductive pad is disposed on the first substrate, wherein the first conductive pad includes a first top surface. The second conductive pad is disposed on the second substrate, wherein the second conductive pad includes a second top surface. The at least two through holes pass through the first substrate and expose a portion of the second top surface. A part of the conductive material is disposed within the at least two through holes, and the conductive material electrically connects the first conductive pad and the second conductive pad. The third substrate is disposed at a side of the second substrate opposite to the first substrate. The third conductive pad is disposed between the second substrate and the third substrate. The another conductive material electrically connects the second conductive pad and the third conductive pad.

From the above, in the embodiments of the present disclosure, the at least two through holes of the electrical connection structure pass through the first substrate and expose a portion of the second top surface of the second conductive pad, and the conductive material is at least partially disposed within the at least two through holes, so as to form electrical conduction paths between the first substrate and the second substrate. Therefore, the electrical connection structure of the present disclosure can achieve the effect of electrically connecting multiple substrates. When it is then applied to an electronic device, the path of electrical conduction between the substrates can be shortened and the design of the peripheral area or region can be simplified, thus making the electronic device a narrow frame design can be realized. In addition, since the electrical connection structure of the present disclosure includes at least two through holes and the first conductive pad and the second conductive pad are electrically connected by making the conductive material at least partially fill the two through holes, at least two electrical connection paths are provided without greatly increasing the component layout area, which can improve the success rate or performance of electrical connection, so that the electrical connection structure of the present disclosure can have better electrical reliability. Furthermore, the electrical connection structure of the present disclosure can be applied to the electronic device, and the electronic device can include one or more electrical connection structures, which can achieve the effect of electrically connecting multiple substrates, and can effectively shorten the electrical conduction paths between multiple substrates.

These and other objectives of the present disclosure will no doubt become obvious to those of ordinary skill in the art after reading the following detailed description of the embodiment that is illustrated in the various figures and drawings.

DETAILED DESCRIPTION

Figure 1:
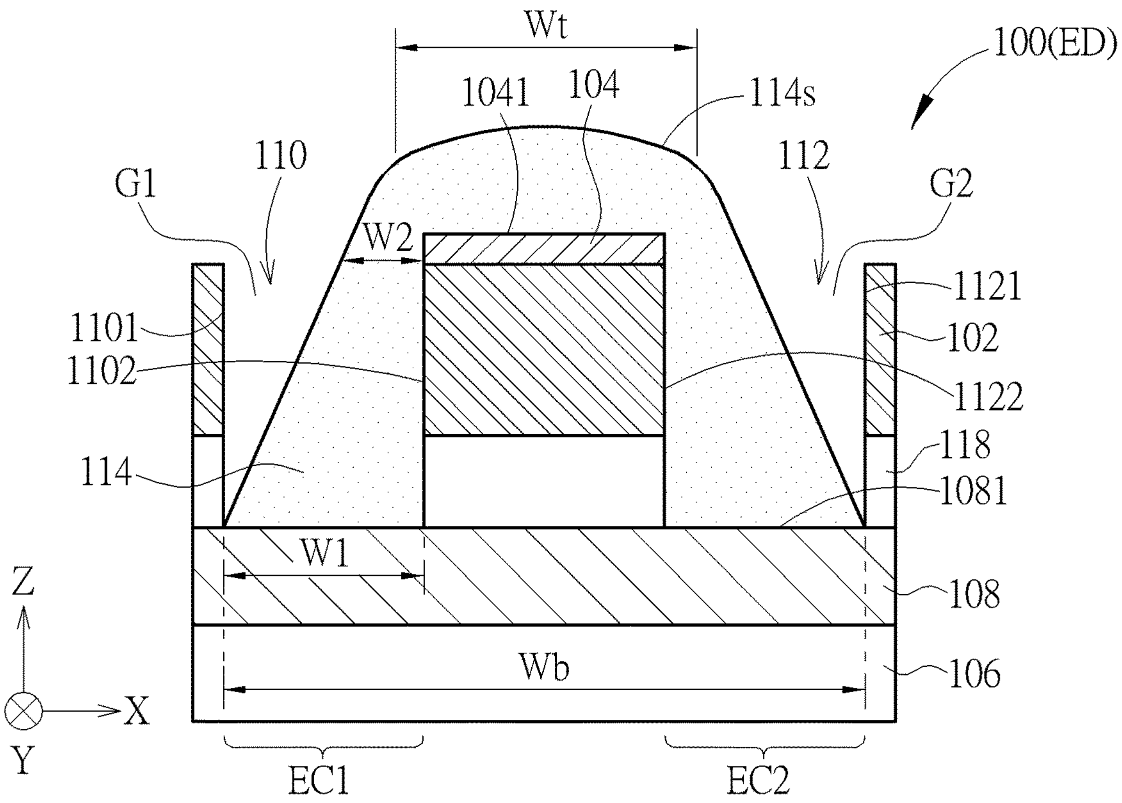
FIG. 1 is a schematic cross-sectional view of an electrical connection structure of a first embodiment of the present disclosure.

The present disclosure may be understood by reference to the following detailed description of embodiments, taken in conjunction with the drawings as described below. It is noted that, for purposes of illustrative clarity and being easily understood by the readers, various drawings of this disclosure show a portion of the device or structure, and certain elements in various drawings may not be drawn to scale. In addition, the number and dimension of each element shown in drawings are only illustrative and are not intended to limit the scope of the present disclosure.

Certain terms are used throughout the description and following claims of the present disclosure for referring to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "include, but not limited to". When the terms "comprising", "including" and/or "having" are used in this specification, they designate the presence of the stated feature, region, step, operation and/or element, but do not exclude the presence or addition of one or more other features, regions, steps, operations, elements and/or combinations thereof.

In addition, relative terms such as "under" or "bottom" and "above", "on" or "top" may be used in the embodiments to describe the relative relationship of one element to another element in the drawings. It can be understood that if flip the device of the drawing to make it upside down, the elements described on the "lower" side will become the elements on the "upper" side.

In some embodiments of the present disclosure, terms such as "connection" and "interconnection" regarding joint and connection, unless otherwise specified, may mean that two structures are in direct contact, or may also mean that two structures are not indirect contact (i.e., indirect contact), where there are other structures located between these two structures. And this term for describing bonding or connection may also include the case where both structures are movable, or both structures are fixed. In addition, the term "coupled" contains the transfer of energy between two structures through direct or indirect electrically connecting means, or the transfer of energy between two separated structures by means of mutual induction.

It will be understood that when an element or film is referred to as being "on" or "connected to" another element or film, it can be directly on or directly connected to the other element or film to another element or layer, or with an intervening element or layer therebetween (the non-direct case). Conversely, when an element is said to be "directly on" another element or layer or "directly connected" to another element or layer, there is no intervening element or layer therebetween.

In the present disclosure, the length, width, thickness, height or area, or the distance or spacing between elements can be measured by optical microscopy (OM), scanning electron microscope (SEM), measured by a film thickness profilometer ($\alpha$-step), ellipsometer, or other suitable means. In detail, according to some embodiments, a scanning electron microscope can be used to obtain the cross-sectional structure image of the elements to be measured, so as to measure the length, width, thickness, height or area of each element, or the distance or spacing between elements, but not limited thereto.

Furthermore, the phrases "a given range from the first value to the second value" and "a given range falls within the range of the first value to the second value" mean that said given range includes the first value, the second value and other values therebetween. If a first direction is described to be perpendicular to a second direction, the angle between the first direction and the second direction may be between 80° and 100°; if the first direction is described to be parallel to the second direction, the angle between the first direction and the second direction may be between 0° and 10°. The terms "about", "equal", "identical" or "same", "substantially" or "generally" are generally interpreted to be within 20% of a given value or range, or to be construed as being within 10%, 5%, 3%, 2%, 1% or 0.5% of a given value or range.

As used in the present disclosure, the terms "film" and/or "layer" may refer to any continuous or discontinuous structures and/or materials (such as materials deposited via the methods disclosed in the present disclosure). For example, films and/or layers may include two-dimensional materials, three-dimensional materials, nanoparticles, or even partial or complete molecular layers, or partial or complete atomic layers, or clusters of atoms and/or molecules. Films or layers may contain a material or layer with pinholes, which may be at least partially continuous.

Although the terms the first, the second, the third . . . can be used to describe a variety of constituent elements, the constituent elements are not limited to these terms. These terms are only used to distinguish a single constituent element from other constituent elements in the specification. Claims may not use the same term, and replace it with the first, the second, the third . . . in the order of element declaration in the claims. Therefore, the first constituent element in the present disclosure specification may be the second constituent element in the claim.

Unless otherwise defined, all terms (including technical and scientific terms) used herein have the same meanings as commonly understood by those skilled in the art to which the present disclosure belongs. It is understood that these terms are defined in commonly used dictionaries and should be interpreted as having the same meaning as the related technology and the background or context of the present disclosure for example, and should not be interpreted in an idealized or overly formal way, unless there is a special definition in the embodiment of the present disclosure.

It should be noted that, from the described embodiments hereinafter and without departing from the spirit of the present disclosure, various features of different embodiments can be replaced, rearranged, or combined to accomplish other embodiments.

Reference will now be made in detail to the exemplary embodiments of the present disclosure, examples of which are illustrated in the accompanying drawings. Wherever possible, the same reference numbers will be used in the drawings and description to refer to the same or like parts.

Figure 2:
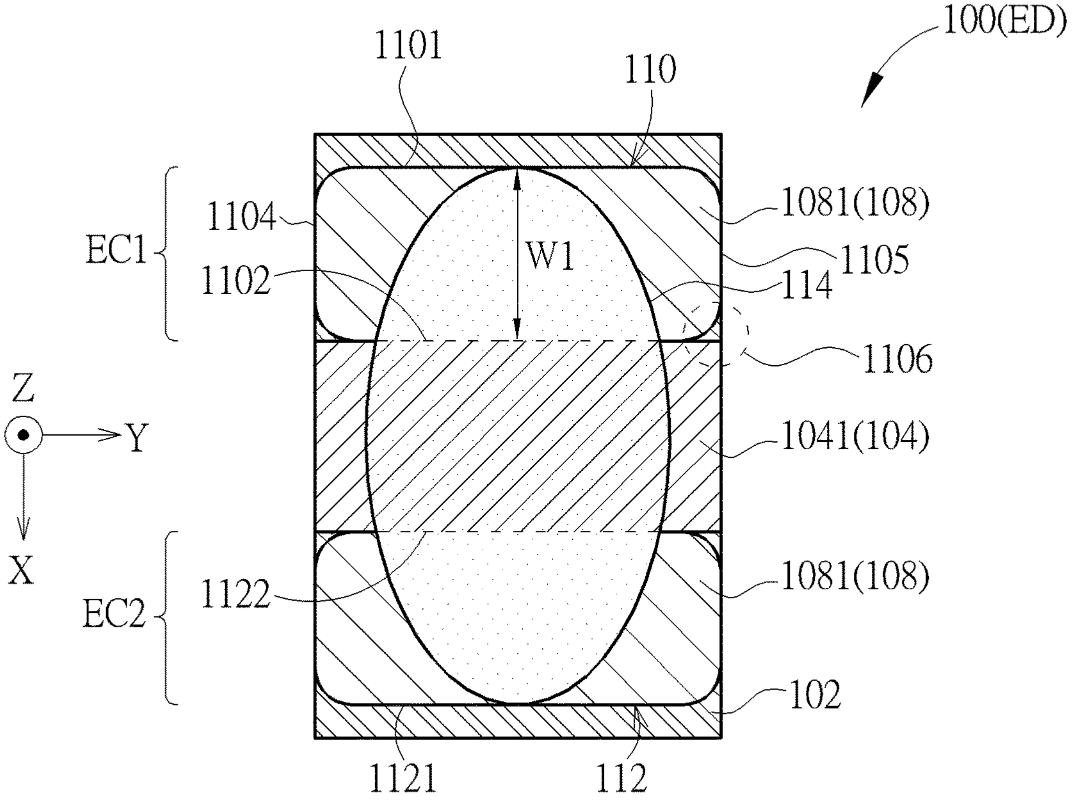
FIG. 2 is a schematic top view of the electrical connection structure of the first embodiment of the present disclosure.

Please refer to FIG. 1 and FIG. 2, FIG. 1 is a schematic cross-sectional view of an electrical connection structure of a first embodiment of the present disclosure, and FIG. 2 is a schematic top view of the electrical connection structure of the first embodiment of the present disclosure. In this embodiment, the electrical connection structure 100 may be applied to an electronic device ED or included in an electronic device ED. The electrical connection structure 100 includes a first substrate 102, a first conductive pad 104, a second substrate 106, a second conductive pad 108, at least two through holes (such as the through hole 110 and the through hole 112) and a conductive material 114. The first conductive pad 104 is disposed on the first substrate 102, wherein the first conductive pad 104 includes a first top surface 1041. The second substrate 106 is disposed at one side of the first substrate 102, such as the lower side shown in FIG. 1. The second conductive pad 108 is disposed on the second substrate 106, wherein the second conductive pad 108 includes a second top surface 1081. The through hole 110 and through hole 112 pass through the first substrate 102 and expose a portion of the second top surface 1081 respectively, that is, the through hole 110 and through hole 112 penetrate through the first substrate 102 respectively so that the first substrate 102 on both sides of each of the through holes 110, 112 is separated. At least a portion of the conductive material 114 is disposed within the through hole 110 and the through hole 112, and the conductive material 114 electrically connects the first conductive pad 104 and the second conductive pad 108 through the through hole 110 and the through hole 112. As shown in FIG. 1, the conductive material 114 can electrically connect the first conductive pad 104 and the second conductive pad 108 by directly contacting the first top surface 1041 of the first conductive pad 104 and the second top surface 1081 of the second conductive pad 108. For example, a portion of the conductive material 114 is located on the first conductive pad 104 with covering and directly contacting the first top surface 1041, and another portion of the conductive material 114 is disposed in the through hole 110 and the through hole 112, wherein the bottom of the another portion completely covers or partially covers the second top surface 1081 exposed by the through hole 110 and through hole 112 and is in direct contact with the second top surface 1081.

In this embodiment, the through hole 110 and through hole 112 may individually have vertical sidewalls and have substantially uniform and equal dimensions from bottom to top. For example, the through hole 110 has the sidewall 1101 and the sidewall 1102, both of which are substantially parallel to the normal direction of the first substrate 102, that is, the direction Z. Wherein, the sidewall 1101 is farther away from the first conductive pad 104 than the sidewall 1102, so the sidewall 1101 may be regarded as the outer sidewall, and the sidewall 1102 may be regarded as the inner sidewall. The distance between the bottom of the sidewall 1101 and the sidewall 1102 may be substantially the same as the distance between the top of the sidewall 1101 and the sidewall 1102. Similarly, for example, the through hole 112 has a sidewall 1121 and a sidewall 1122, wherein the sidewall 1121 is further away from the first conductive pad 104 than the sidewall 1122, so the sidewall 1121 may be regarded as the outer wall, and the sidewall 1122 may be regarded as the inner wall. The distance between the bottom of the sidewall 1121 and the sidewall 1122 may be substantially the same as that of the distance between the top of the sidewall 1121 and the sidewall 1122. In this embodiment, the portion of the conductive material 114 disposed within the through hole 110 or the through hole 112 may have a cross-sectional shape with a wide bottom and a narrow top, so the through hole 110 or through hole 112 is not completely filled with the conductive material 114. Accordingly, there are air gap Gland air gap G2 between the conductive material 114 and the through hole 110 and through hole 112 respectively, but not limited thereto. In some embodiments, the through hole 110 and through hole 112 may be completely filled with the conductive material 114 without air gaps existing therein. In addition, as shown in FIG. 1, the conductive material 114 may extend downward from the top of the through hole 110 and through hole 112, cover at least a portion of the sidewall 1102 and at least a portion of the sidewall 1122 and further extend to the bottom of the through hole 110 and through hole 112. Since the conductive material 114 has a wider bottom, its bottom can contact at least a portion of the sidewall 1101 and at least a portion of the sidewall 1121, but not limited thereto. In the structure where the conductive material 114 has a wider bottom, the contact area between the second conductive pad 108 and the conductive material 114 can be raised such that the success rate of electrical connection between the first conductive pad 104 and the second conductive pad 108 can be improved. In some embodiments, the first conductive pad 104 may be electrically connected to any suitable wire or electronic component inside or on the surface of the first substrate 102, or the first conductive pad 104 may serve as a connection pad of the first substrate 102 for transmitting signals to external component(s) or as a part of the first substrate 102; the second conductive pad 108 may be electrically connected to any suitable wire or electronic component inside or on the surface of the second substrate 104, or the second conductive pad 108 may serve as a connection pad of the second substrate 104 for transmitting signals to external component(s) or as a part of the second substrate 104. Therefore, the present disclosure adopts the conductive material 114 for electrically connecting the first conductive pad 104 on the upper side of the first substrate 102 and the second conductive pad 108 on the lower side of the first substrate 102 via passing through the through hole 110 and through hole 112 of the first substrate 102, which may also be regarded as using the conductive material 114 to achieve a short conduction path for electrically connecting the first substrate 102 and the second substrate 106, wherein wires or traces are not needed for the electrical connection.

As shown in FIG. 2, in a top view direction (i.e., in a top view), the first conductive pad 104 is located between the through hole 110 and the through hole 112. The first conductive pad 104 may have a quadrilateral shape. The through hole 110 and the through. The hole 112 are respectively located on two different sides of the first conductive pad 104 and may respectively have a quadrilateral shape, wherein the above-mentioned quadrilateral shape may be, for example, a rectangular shape or a rectangular-like shape, but not limited thereto. For example, the long sides of the rectangles of the through hole 110, the through hole 112 and the first conductive pad 104 are parallel to each other, but it is not limited thereto. In this embodiment, the through hole 110 and through hole 112 respectively have a rectangular-like shape as an example. For example, the through hole 110 have a sidewall 1101 and a sidewall correspondingly parallel to each other and have a sidewall 1104 and a sidewall 1105 correspondingly parallel to each other, wherein the sidewall 1101 and sidewall 1102 may be long sides of the rectangle and parallel to the direction Y, and the sidewall 1104 and sidewall 1105 may be short sides of the rectangle and parallel to the direction X. The sidewall 1104 is adjoined between the sidewall 1101 and the sidewall 1102, and the sidewall 1105 is adjoined between the sidewall 1101 and the sidewall 1102 on the other side. In some embodiments, in a top view, the adjoining parts of the sidewalls of the through hole 110 form an arc-shaped corner 1106 respectively. The through hole 112 also have a design similar to that of the through hole 110, so details will not be repeated. Furthermore, the conductive material 114 covers at least a portion of the first conductive pad 104, at least a portion of the through hole 112 and at least a portion of the through hole 110. The number of through holes and the disposition locations and shapes of the first conductive pad and the conductive material in the electrical connection structure 100 of the present disclosure may be changed according to requirements and are not limited to FIG. 2. However, it should be noted that the electrical connection structure 100 of the present disclosure includes at least two through holes 110 and 112, and therefore at least two conduction paths are formed through the conductive material 114 between the first conductive pad 104 and the second conductive pad 108, respectively represented as the conduction structure EC1 and the conduction structure EC2, so as to provide double or multiple insurance with multiple conduction paths to improve the electrical connection effect or operation stability.

The way of disposing the conductive material 114 in the through hole 110 and through hole 112 may include solder paste printing, inkjet printing, chemical vapor deposition, physical vapor deposition, electroplating or other suitable processes, or a combination of the above processes, but not limited thereto. The material of the conductive material 114 may include tantalum (Ta), niobium (Nb), hafnium (Hf), nickel (Ni), chromium (Cr), cobalt (Co), zirconium (Zr), tungsten (W), aluminum (Al), tin (Sn), copper (Cu), silver (Ag), aurum (Au) or other suitable metals, or alloys or combinations of the above materials, but not limited thereto. The formation method of the through hole 110 and through hole 112 man be, for example, mechanical drilling, laser drilling, ultrasonic drilling, micro electrical discharge machining (μ-EDM), micro powder blasting, inductively coupled plasma reactive ion etching (ICP-RIE) or other suitable processes, or a combination of the above methods, but not limited thereto. In addition, the drilling process may be performed at the upper side or the lower side of the first substrate 102 to form the through hole 110 and through hole 112.

The first substrate 102 and the second substrate 106 may individually for example be a rigid substrate, a flexible substrate or a combination of the above. The material of the first substrate 102 and the second substrate 106 may individually be, for example, glass, quartz, sapphire, ceramics, polycarbonate (PC), polyimide (PI), polyethylene terephthalate (PET), other suitable substrate materials or combinations thereof, but not limited thereto. In some embodiments, the first substrate 102 and the second substrate 106 may respectively include a layer-stacked structure, for example respectively include a structure having a base layer, a dielectric layer, a conductive layer, a semiconductor layer, an insulating layer, a protection layer, a light-emitting layer, an encapsulation layer and/or other suitable stacking layers, or a combination of the above stacking layers, but not limited thereto. The first substrate 102 and the second substrate 106 may respectively include circuits or electronic components, such as a circuit board, but not limited thereto. In this embodiment, the material of the first substrate 102 is exemplified by polyimide, and the second substrate 106 is exemplified by a flexible or rigid printed circuit board, but not limited thereto. Furthermore, as shown in FIG. 1, the electrical connection structure 100 of this embodiment may also include an interlayer 118, which is disposed between the first substrate 102 and the second substrate 106 and covers the second conductive pad 108. The through hole 110 and through hole 112 pass through the first substrate 102 and a portion of the interlayer 118, and expose portions of the second top surface 1081. In other words, the interlayer 118 may be disposed between at least two of plural substrates. The material of the interlayer 118 may include organic material, inorganic material, other suitable materials or a combination of above material, but not limited thereto. In some embodiments, the interlayer 118 may adhere to at least two of the plural substrates. For example, the interlayer 118 may include an adhesive material or may serve as an adhesive layer.

According to the present disclosure, the through hole 110 and through hole 112 pass through the first substrate 102 and expose portions of the second top surface 1081 of the second conductive pad 108, and the conductive material 114 is partially disposed in the through hole 110 and through hole 112, such that the first substrate 102 and the second substrate 106 are electrically connected to each other. Therefore, the electrical connection structure 100 of this embodiment can achieve the effect of electrically connecting multiple substrates, and when it is then applied to an electronic device, the electrical conduction path between the first substrate 102 and the second substrate 102 can be greatly shortened. Accordingly, the design of the peripheral regions of the first substrate 102 and the second substrate 106 may also be simplified, enabling to realize a design of the electronic device with a narrow border or even no border. In addition, the first substrate 102 has two or more through holes 110, 112 and the conductive material 114 is disposed in the through holes, so that there are multiple conduction paths between the first conductive pad 104 and the second conductive pad 108, that is, there may be two or more conduction structures EC1, EC2 between the first substrate 102 and the second substrate 108, so that the conduction between the two has multiple insurances, and the reliability of the electrical connection can be improved. Furthermore, in a cross-sectional view, the maximum width Wb (or size) of the bottom of the conductive material 114 is greater than the maximum width Wt (or size) of the top of the conductive material 114, and the width W1 of the bottom of the conductive material 114 in one single through hole (such as the through hole 110) is also greater than the width W2 of the top thereof, so as to increase the contact length or contact area of the conductive material 114 and the second conductive pad 108, thereby improving the success rate of electrical connection. The material 114 may have an arc-shaped top surface 114*s*, and when other thin films are deposited on the conductive material 114 in subsequent processes, it may facilitate better sidewall step coverage during thin film deposition.

It should be noted that the following embodiments continue using the component numerals and some contents of the aforementioned embodiment, wherein the same numerals are used to indicate the same or similar components, and the description of the same technical content is omitted. For the description of the omitted part, please refer to the aforementioned embodiment, wherein the same content will not be repeated in the following embodiments.

Figure 3:
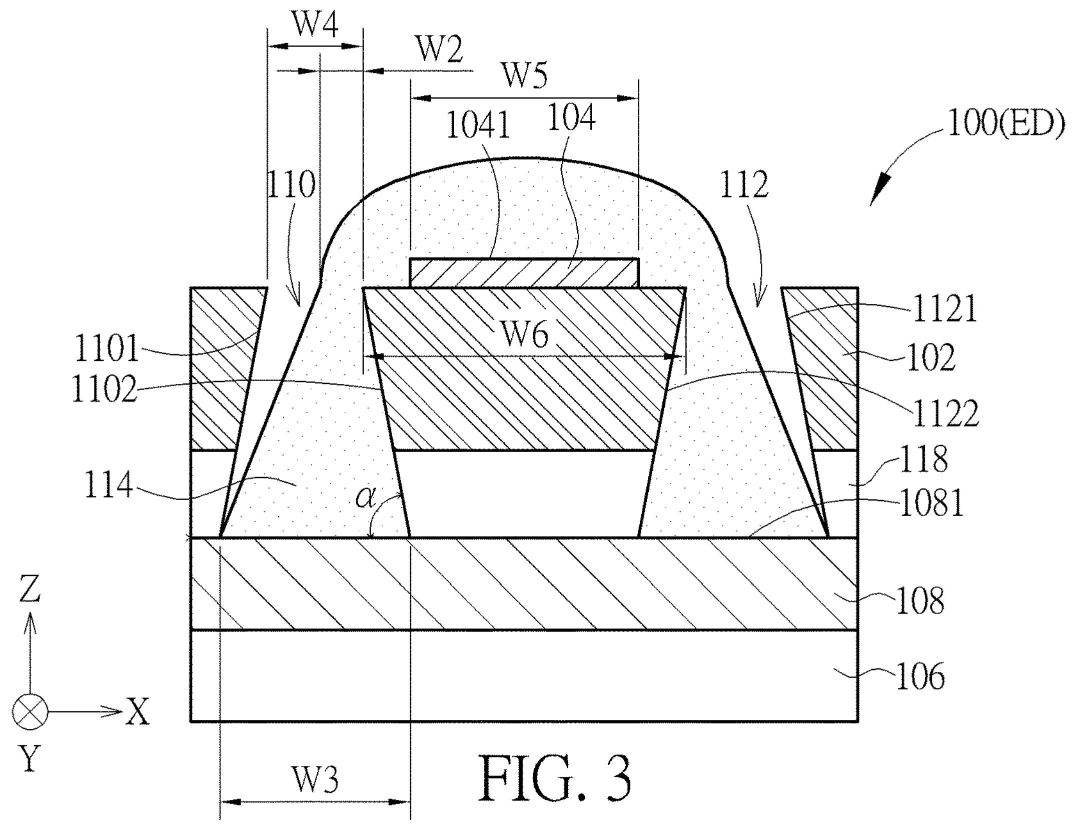
FIG. 3 is a schematic cross-sectional view of an electrical connection structure of a second embodiment of the present disclosure.

FIG. 3 is a schematic cross-sectional view of an electrical connection structure of a second embodiment of the present disclosure. Referring to FIG. 1 and FIG. 3 at the same time, the difference between the electrical connection structures 100 in FIG. 3 and in FIG. 1 is that the through hole 110 and through hole 112 in FIG. 3 respectively have inclined sidewalls, that is, the sidewall 1101, sidewall 1102, sidewall 1121, and sidewall 1122 are not parallel to the normal direction of the first substrate 102 (i.e., direction Z). For example, the included angle α between any sidewall 1101 or 1102 of the through hole 110 and the second top surface 1081 is an acute angle, so that the cross-sectional shape of the through hole 110 generally presents a trapezoid with a narrow top and a wide bottom, that is, the width W3 of the bottom of the through hole 110 is greater than the width W4 of its top. The through hole 112 also has a similar design, which will not be redundantly described. In addition, the width W1 (as marked in FIG. 1) at the bottom of the conductive material 114 in a single through hole 110 is also greater than the width W2 at the top, thus the bottom of the conductive material 114 can be in contact with the sidewall 1101 and the sidewall 1102 at the same time, which means the width W1 may be substantially the same as the width W3. The above design makes the conductive material 114 have a larger bottom area so as to have a larger contact area with the second top surface 1081 of the second conductive pad 108, therefore improving the electrical connection effect. On the other hand, the width W5 of the first conductive pad 104 in this embodiment may be smaller than the width W6 of the first substrate 102 located between the through hole 110 and through hole 112 on the lower side thereof, but the present disclosure is not limited to that shown in FIG. 3, and the width W5 can also be the same as the width W6 in an variant embodiment.

Figure 4:
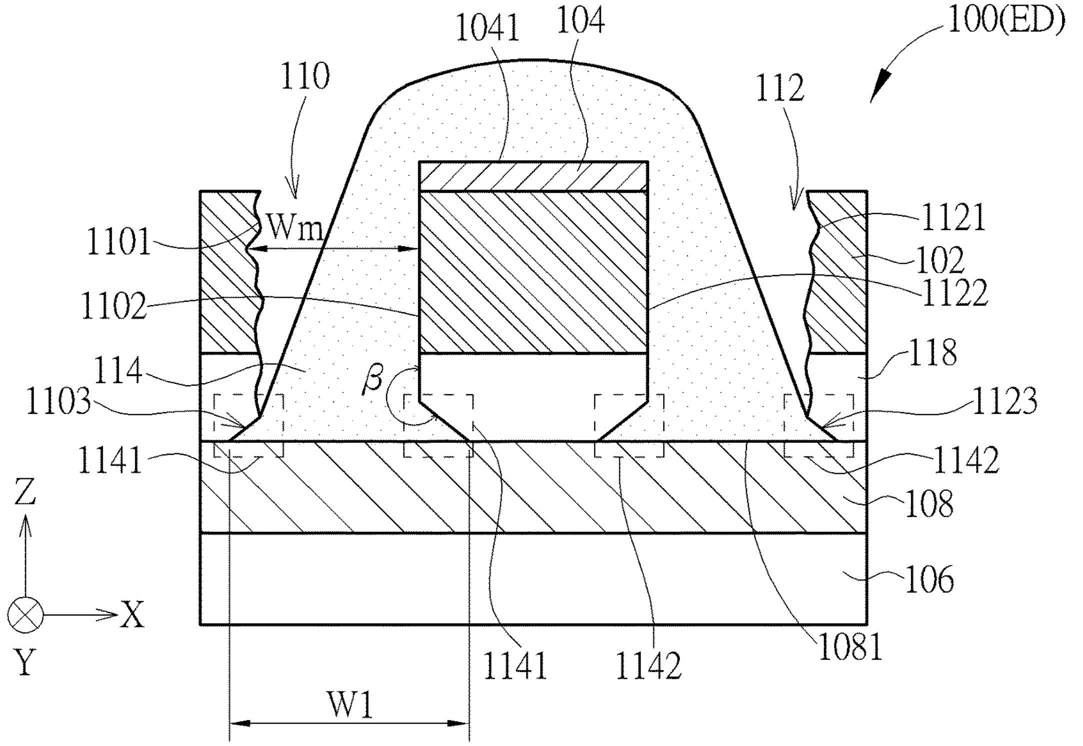
FIG. 4 is a schematic cross-sectional view of an electrical connection structure of a third embodiment of the present disclosure.

FIG. 4 is a schematic cross-sectional view of an electrical connection structure of a third embodiment of the present disclosure. The difference between FIG. 4 and FIG. 1 is that the sidewalls of the through hole 110 and through hole 112 in the embodiment shown in FIG. 4 may have irregular shapes respectively, and the conductive material 114 has a wide part 1141 and a wide part 1142 located in the through hole 110 and through hole 112 and at the bottom of the through hole 110 and through hole 112, near the second top surface 1081, respectively. In detail, the outer sidewall 1101 of the through hole 110 and the outer sidewall 1121 of the through hole 112 in this embodiment may be irregular sidewalls, generally both of which still extend along the direction Z, but have uneven or irregular surfaces. On the other hand, the inner sidewall 1102 of the through hole 110 and the inner sidewall 1122 of the through hole 112 may be regular sidewalls, which means they may have substantially smooth surfaces; for example, their surfaces may be substantially parallel to the direction Z, but the present disclosure is limited to the above. In variant embodiments, the sidewall 1102 and sidewall 1122 may also be irregular sidewalls. Furthermore, in this embodiment, the conductive material 114 includes at least two wide parts (that is, the wide part 1141 and wide part 1142), respectively located in the through hole 110 and through hole 112. Taking the conductive material 114 in the through hole 110 as an example, its bottom portion close to the second top surface 1081 has a maximum width W1 in the direction X, wherein the width W1 of the bottom is greater than the maximum width Wm of other parts of the through hole 110 (such as the part not adjacent to the second top surface 1081) in the direction X. In this case, the bottom portion of the conductive material 114 sandwiched between the sidewall 1101 and the second top surface 1081 of the second conductive pad 108 may be designed as a wide part 1141, and the bottom portion of the conductive material 1141 sandwiched between the sidewall 1102 and the second top surface 1081 of the second conductive pad 108 may be designed as another wide part 1141. Similarly, in the through hole 112, the bottom portion of the conductive material 114 sandwiched between the sidewall 1121 and the second conductive pad 108 may be designed as a wide part 1142, and the bottom portion of the conductive material 114 sandwiched between the sidewall 1122 and the second conductive pad 108 may be designed as another wide part 1142. Furthermore, the through hole 110 and through hole 112 respectively have at least one concave part (that is, the concave part 1103 and concave part 1123), and the concave part 1103 and concave part 1123 correspond to the wide part 1141 and wide part 1142 of the conductive material 114 respectively 1142, to accommodate the wide part 1141 and wide part 1142. Taking the concave part 1103 in the through hole 110 as an example, it can be designed as an extra excavated area of the sidewall (such as the sidewall 1102) at its bottom portion near the second top surface 1081. For example, the bottom portion of the through hole 110 and the extension direction of its sidewall 1102 (such as parallel to the direction Z in FIG. 4) may have a large included angle R, wherein the included angle β may be greater than 180°, such that the bottom portion of the through hole 110 has an extra excavated area toward the middle layer 118 so as to form the concave part 1103. From the above, it can be seen that the concave part 1103, concave part 1123, wide part 1141 and wide part 1142 are all adjacent to the second conductive pad 108.

Figure 5:
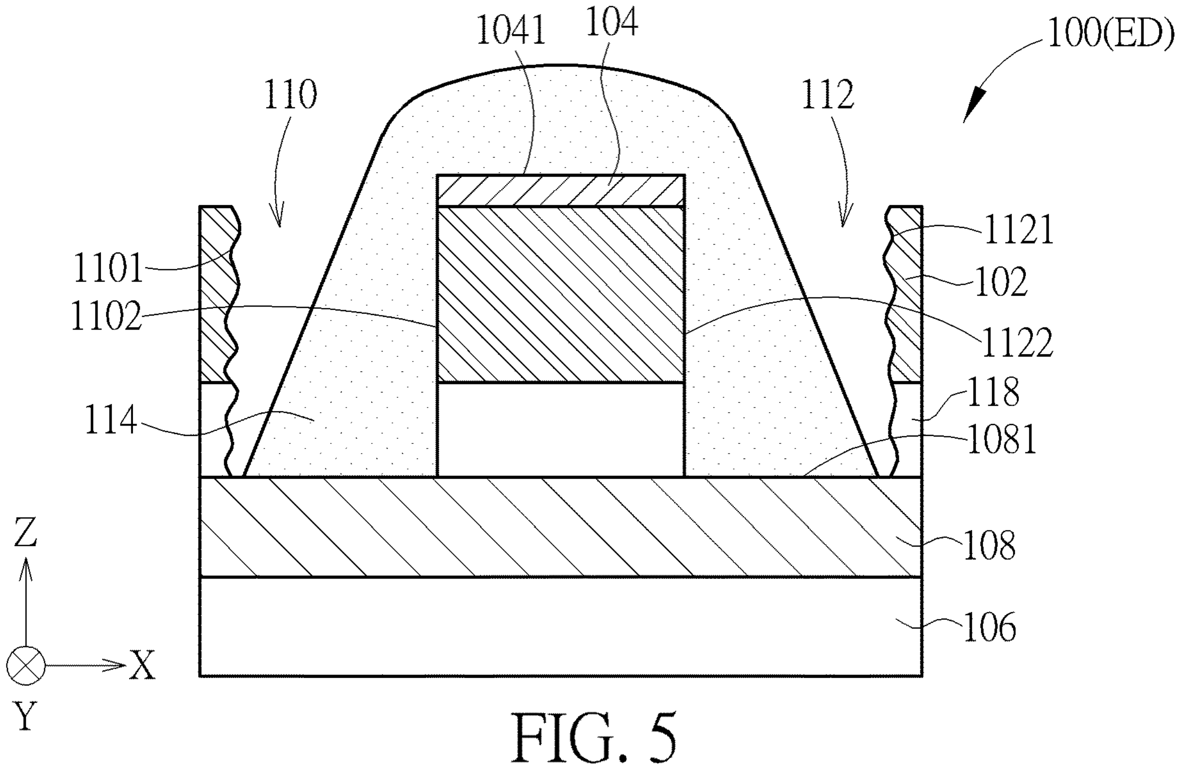
FIG. 5 is a schematic cross-sectional view of an electrical connection structure of a variant embodiment of the third embodiment shown in FIG. 4.

FIG. 5 is a schematic cross-sectional view of an electrical connection structure of a variant embodiment of the third embodiment shown in FIG. 4. The electrical connection structure 100 shown in FIG. 5 is different from FIG. 4 in that the conductive material 114 may not have the wide part 1141 and wide part 1142, while the through hole 110 and through hole 112 may not have the concave part 1103 and concave part 1123. In addition, the bottom of the conductive material 114 of the electrical connection structure 100 in FIG. 5 may have a small interval space from the outer sidewall 1101 of the through hole 110 and the outer sidewall 1121 of the through hole 112 respectively (that is, the conductive material does not completely fill the through holes), but not limited thereto. In other variant embodiments, the bottom of the conductive material 114 may directly contact the sidewall 1101 and the sidewall 1121, similar to the structure shown in FIG. 1. Other details of the structure of the electrical connection structure 100 shown in FIG. 5 may refer to the descriptions related to FIG. 1 and FIG. 4, and will not be repeated herein.

Figure 6:
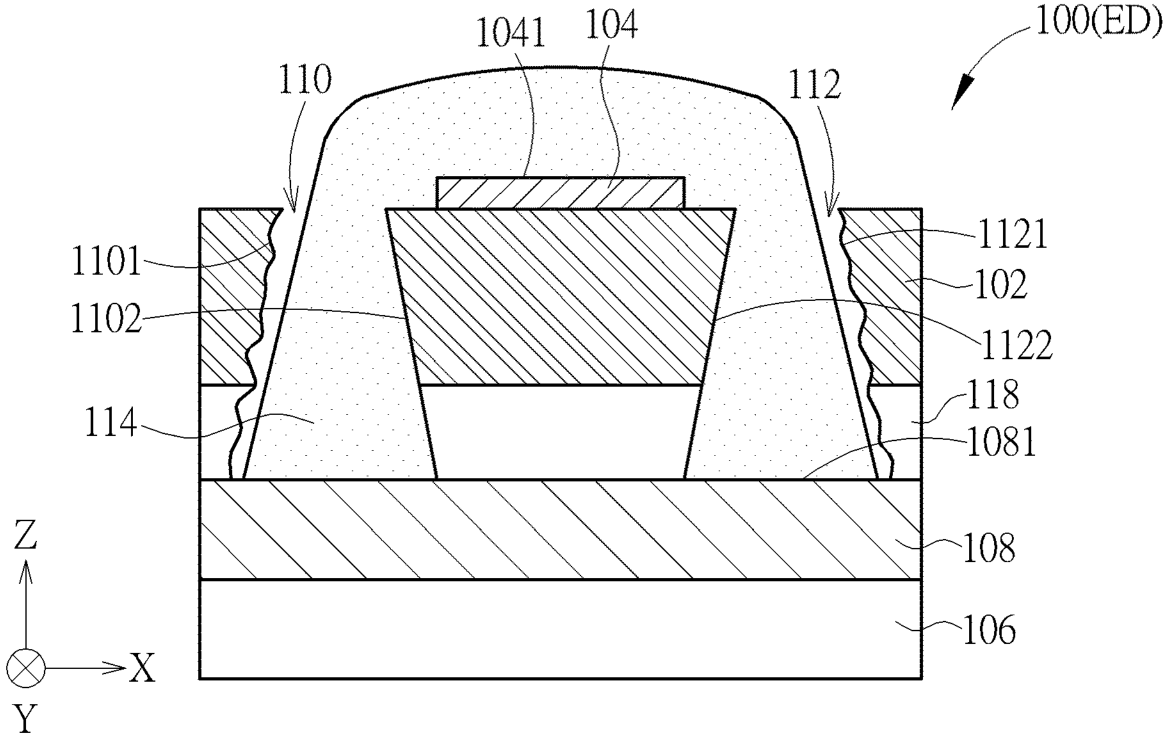
FIG. 6 is a schematic cross-sectional view of an electrical connection structure of a variant embodiment of the second embodiment shown in FIG. 3.

FIG. 6 is a schematic cross-sectional view of an electrical connection structure of a variant embodiment of the second embodiment shown in FIG. 3. The electrical connection structure 100 shown in FIG. 6 is different from FIG. 3 in that the through hole 110 may have an irregular sidewall 1101 and the through hole 112 may have an irregular sidewall 1121. In addition, the bottom of the conductive material 114 of the electrical connection structure 100 in FIG. 6 may have a small interval space from the outer sidewall 1101 of the through hole 110 and the outer sidewall 1121 of the through hole 112 respectively (that is, the conductive material does not completely fill the through holes), but not limited thereto. In other variant embodiments, the bottom of the conductive material 114 may directly contact the sidewall 1101 and the sidewall 1121. Other details of the structure of the electrical connection structure 100 shown in FIG. 6 may reference to the descriptions related to FIG. 1 and FIG. 3, and will not be repeated herein.

Figure 7:
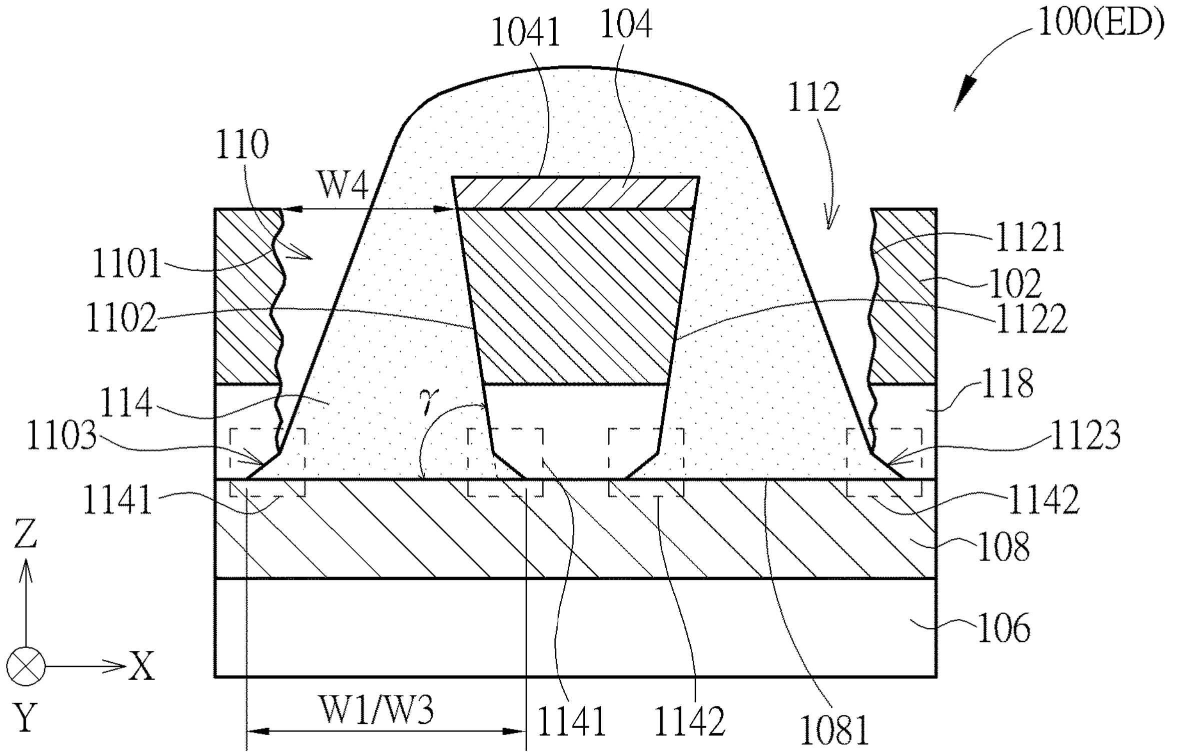
FIG. 7 is a schematic cross-sectional view of an electrical connection structure of a fourth embodiment of the present disclosure.

FIG. 7 is a schematic cross-sectional view of an electrical connection structure of a fourth embodiment of the present disclosure. The difference between FIG. 7 and FIG. 4 is that the through hole 110 and through hole 112 in the embodiment shown in FIG. 7 respectively have an inclined inner sidewall 1102 and an inclined inner sidewall 1122. Specifically, the included angle γ between the extension line of the sidewall 1102 and the second top surface 1081 of the second conductive pad 108 is not a right angle, wherein the angle γ is, for example, an acute angle; and the included angle of the extension line of the sidewall 1121 and the second top surface 1081 of the second conductive pad 108 may also be an acute angle, which will not be described in detail. Furthermore, in this embodiment, the through hole 110 has at least one wide part 1141 adjacent to the second conductive pad 108, wherein FIG. 7 shows two wide parts 1141 as an example. Taking the sidewall 1102 as an example, the included angle between the sidewall surface at the wide part 1141 and the second top surface 1081 is an acute angle, which may be even smaller than the included angle γ. On the other hand, the included angle between the sidewall surface of the sidewall 1101 at the wide part 1141 and the second top surface 1081 is also smaller than the included angle between the extension direction of the sidewall 1101 (parallel to the direction Z) and the second top surface 1081, which will not be detailed herein. The sidewall 1122 and sidewall 1121 of the through hole 112 also have a similar structure and will not be repeated herein. The design of the above-mentioned sidewall 1102 and sidewall 1122 inclining toward the interlayer 118 can expand the bottom areas of the through hole 110 and through hole 112, which increases the contact area of the second conductive pad 108 and the conductive material 114 filled in the through hole 110 and through hole 112, while the design of the wide part 1141 and wide part 1142 even further increases the contact area of the second conductive pad 108 and the conductive material 114. According to this design, the through hole 110 and through hole 112 may respectively have a smaller upper width W4 (or size), so that the first conductive pad 104 between the two may still have a larger size, thus the first top surface 1041 thereof and the conductive material 114 may have a larger contact area; and at the same time, the through hole 110 and through hole 112 can have a larger lower width W3 respectively, such that the conductive material 114 also has a larger contact area at the bottoms of the through hole 110 and through hole 112 with the second conductive pad 108. In short, under the condition of maintaining the upper dimensions of the through hole 110 and through hole 112, the structural design of this embodiment can increase the contact area of the conductive material 114 and the first conductive pad 104 and the contact area of the conductive material 114 and the second conductive pad 108 at the same time, thereby improving the success rate of the electrical connection between the first conductive pad 104 and the second conductive pad 108.

Figure 8:
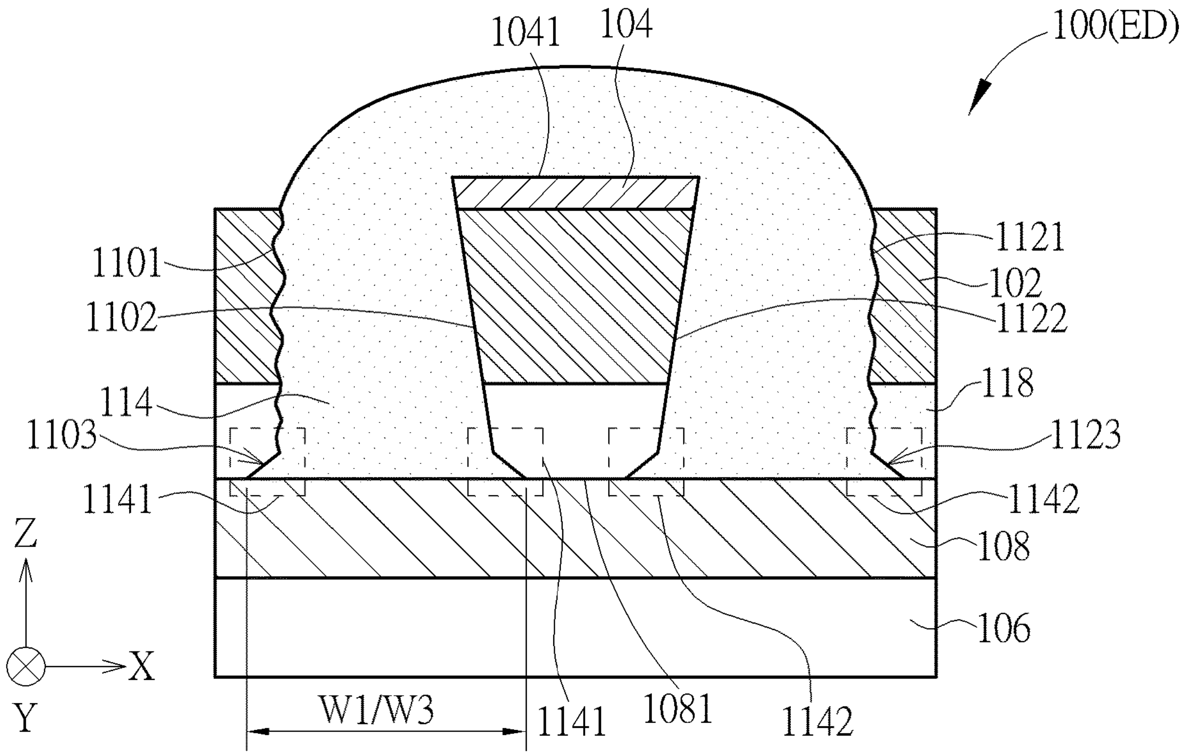
FIG. 8 is a schematic cross-sectional view of an electrical connection structure of a fifth embodiment of the present disclosure.

FIG. 8 is a schematic cross-sectional view of an electrical connection structure of a fifth embodiment of the present disclosure. The difference between FIG. 8 and FIG. 7 is in that the through hole 110 and through hole 112 may be fully filled with the conductive material 114 in the embodiment shown in FIG. 8, thus there may be no air gap G1 and air gap G2 (as shown in FIG. 1) existing in the through hole 110 and through hole 112. In this embodiment, the conductive material 114 still has the wide part 1141 and wide part 1142, and therefore the bottom of the conductive material 114 still has a maximum width W1 in one single through hole 110 or through hole 112. For other details of the electrical connection structure 100 shown in FIG. 8, references may be made to the descriptions related to FIG. 1 and FIG. 7, and details will not be repeated herein.

Figure 9:
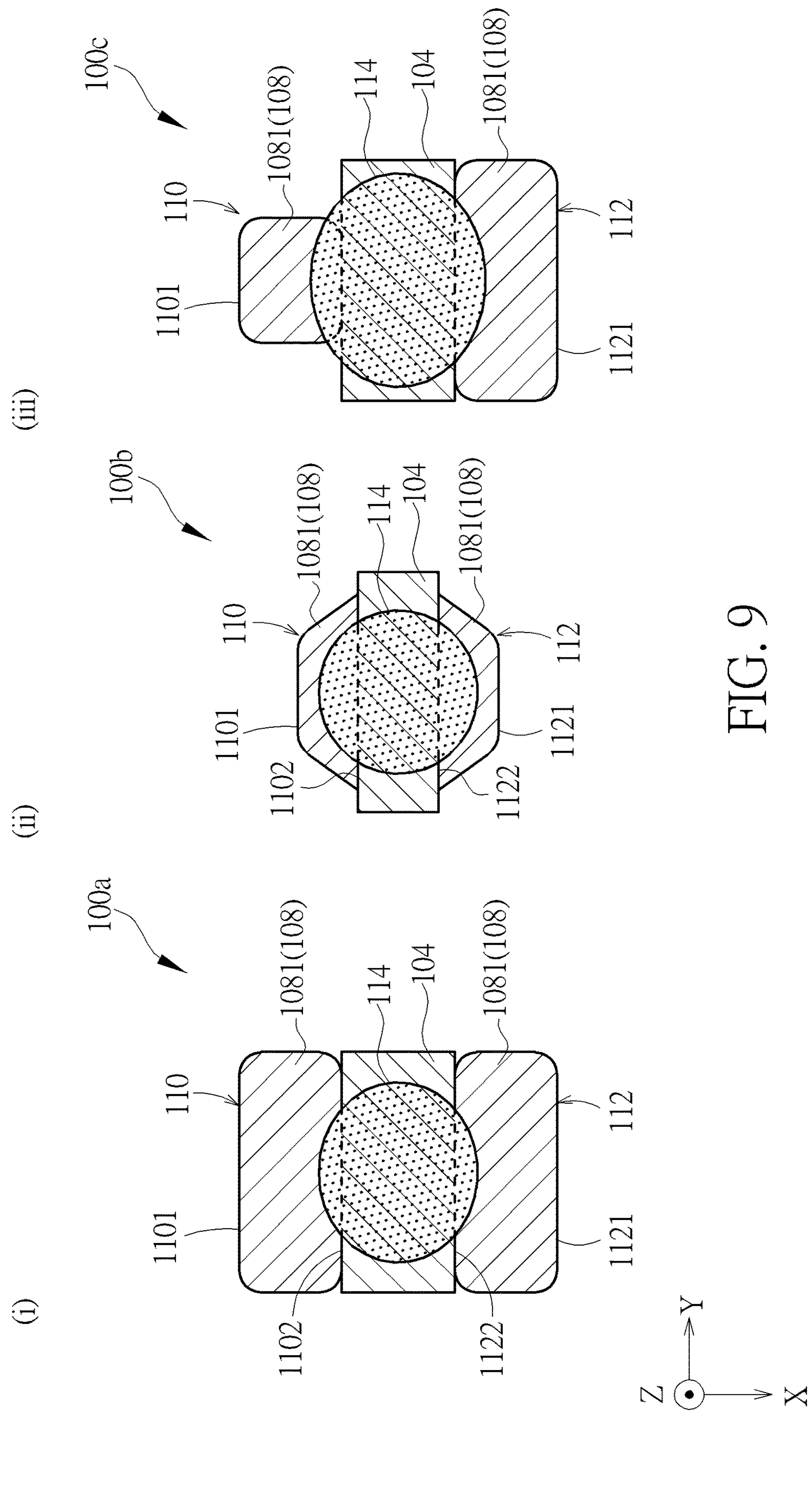
FIG. 9 is a schematic top view showing the configurations of the first conductive pad, the through holes and the conductive material of the electrical connection structures of different variant embodiments of the present disclosure.
Figure 10:
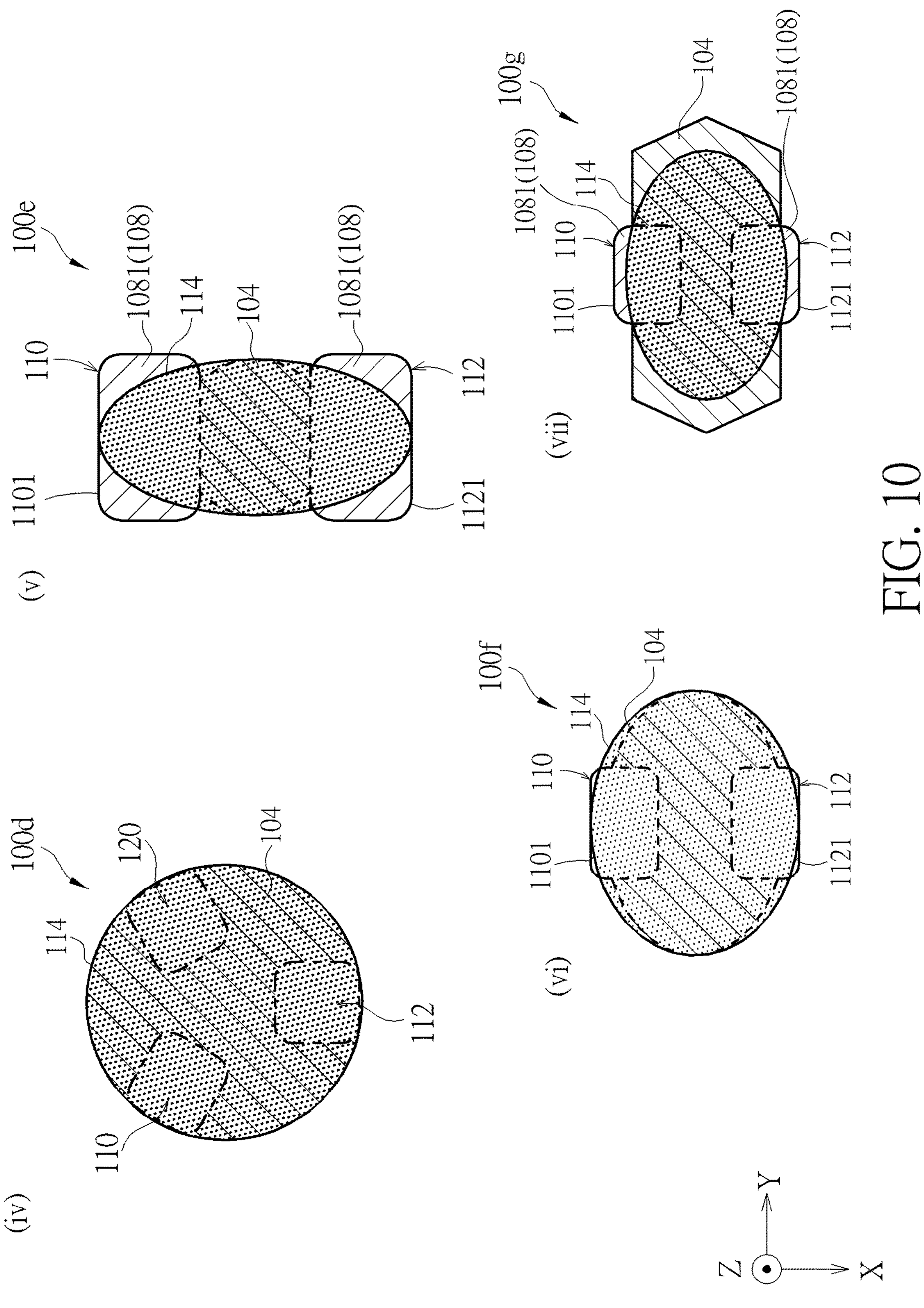
FIG. 10 is another schematic top view showing the configurations of the first conductive pad, the through holes and the conductive material of the electrical connection structures of different variant embodiments of the present disclosure.

FIG. 9 and FIG. 10 are schematic top views of the configurations of the first conductive pad, the through holes and the conductive material of the electrical connection structures of different variant embodiments of the present disclosure, wherein other components of the electrical connection structures are not shown for simplifying the figures and may be referred to FIG. 1 to FIG. 8. In the electrical connection structure **100*a* of the example (i) shown in FIG. 9, its top view configuration is similar to the structure shown in FIG. 2, while the difference between the two is that the conductive material 114 in the electrical connection structure 100*a* has no contact with the sidewall 1101 and the sidewall 1121 in the direction X. In the example (ii) of FIG. 9, the through hole 110 and through hole 112 of the electrical connection structure 100*b* may respectively be a trapezoid or have a trapezoid-like shape. For example, the length of the sidewall 1102 is greater than the length of the sidewall 1101, and the length of the sidewall 1122 is greater than the length of the sidewall 1121. In addition, the top view pattern of the conductive material 114 in the electrical connection structure 100*b* is similar to a circle, but it is not limited thereto. For example, the top view pattern of the conductive material 114 may be an ellipse. The main difference between the electrical connection structure 100*c* of the example (iii) and the example (i) in FIG. 9 is that the size of one of the through hole 110 and through hole 112 may be smaller than the other one, that is, the through hole 110 and through hole 112 may have different sizes or shapes. The electrical connection structure 100*d* in the example (iv) shown in FIG. 10 includes three through holes, which are the through hole 110, the through hole 112 and the through hole 120, and may have a top view pattern of square-like shape respectively, but not limited thereto. In addition, the first conductive pad 104 and the conductive material 114 of the electrical connection structure 100*d* individually have a circular top view pattern. For example, the conductive material 114 may completely overlap or completely cover the first conductive pad 104, and may completely cover and fill the through hole 110, the through hole 112 and the through hole 120. The main difference between the example (v) of FIG. 10 and the example (i) of FIG. 9 is that the left and right sides of the top view pattern of the first conductive pad 104 of the electrical connection structure 100*e* of the example (v) may have curved sides, while the upper and lower sides may be aligned with the sides of the through hole 110 and through hole 112, the conductive material 114 has an elliptical top view pattern, and its long axis is parallel to the direction X, that is, across the through hole 112, the first conductive pad 104 and the through hole 110, so as to completely cover the first conductive pad 104, wherein the conductive material 114 may be in contact with the outer sidewall 1101 of the through hole 110 and the outer sidewall 1121 of the through hole 112. The top view patterns of the first conductive pad 104 and the conductive material 114 of the electrical connection structure 100*f* of the example (vi) of FIG. 10 may both be elliptical with long axes parallel to the direction Y, and the widths of both of them in the direction Y are greater than the widths of the through hole 110 and through hole 112** in the direction Y. On the other hand, the conductive material

114 may completely cover the first conductive pad 104 and be in contact with the outer sidewall 1101 of the through hole 110 and the outer sidewall 1121 of the through hole 112. The first conductive pad 104 of the electrical connection structure 100g of the example (vii) of FIG. 10 has a top view pattern with a hexagonal shape whose area is greater than the area of the conductive material 114, wherein the conductive material 114 has an ellipse or circular top view pattern and the widths of the first conductive pad 104 and the conductive material 114 in the direction Y are greater than the widths of the through hole 110 and through hole 112 in the direction Y. The above examples are only exemplifications of the configuration of the numbers, shapes, sizes and relative positions of the first conductive pad 104, the conductive material 114, the through hole 110, the through hole 112 and/or the through hole 120 of the present disclosure, and are not intended to limit the present disclosure. The actual number, shape and size and relative position may be changed and adjusted according to product requirements.

It is worth mentioning that, the number of the electrical connection structure is schematically shown as one and the number of the substrates is schematically shown as two or three in the above embodiments, but it is not limited thereto. The number of electrical connection structures and the number of substrates may be increased according to requirements in other embodiments not illustrated, which still belong to the claimed scope of the present disclosure. Moreover, any one of the electrical connection structures in the above specification or the combination of any of the above electrical connection structures may be selected as a claimed electrical connection structure or applying to a claimed electronic device of the present disclosure, but not limited thereto.

Figure 11:
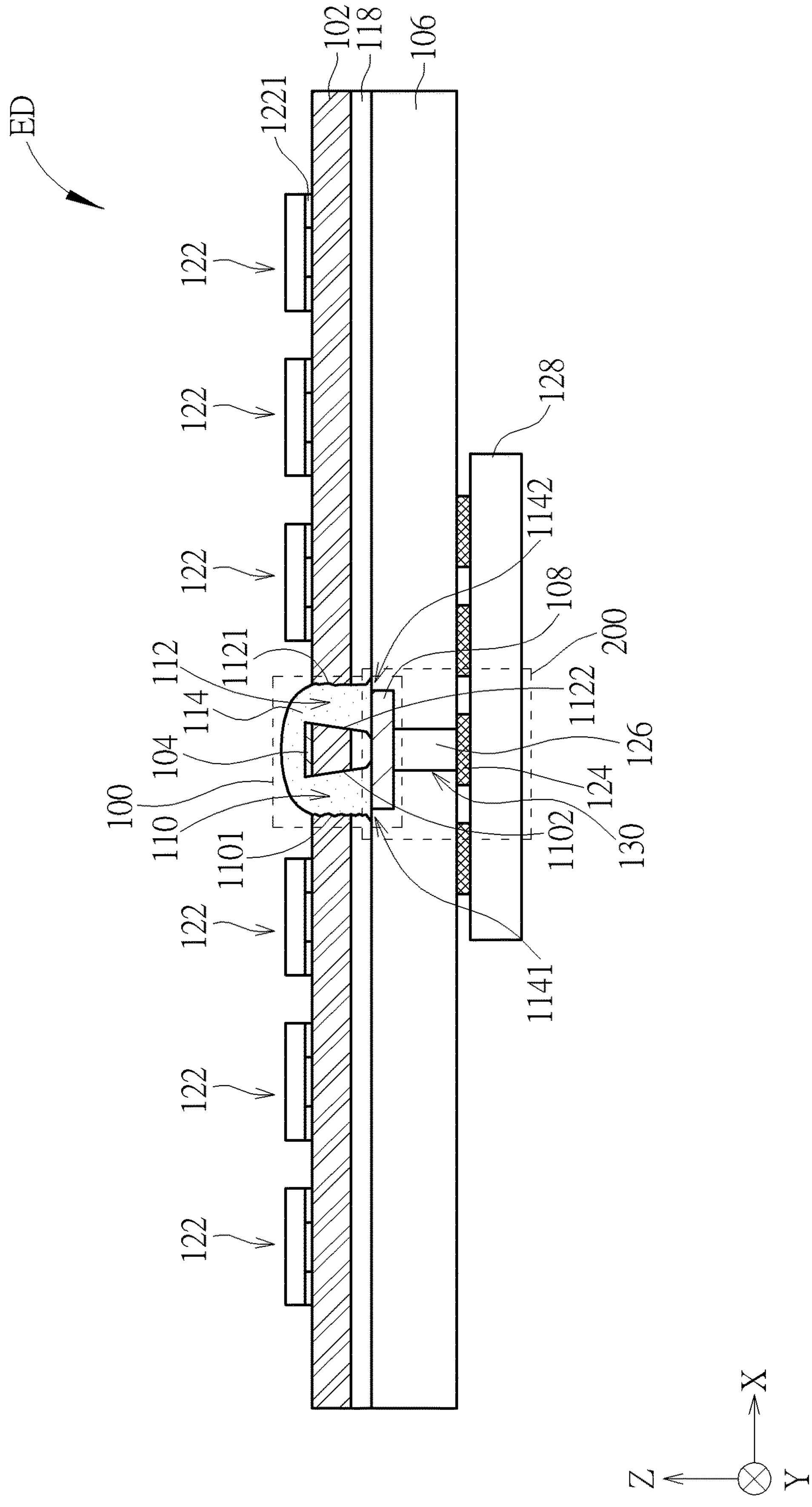
FIG. 11 is a schematic cross-sectional view of an electronic device of an embodiment of the present disclosure.

FIG. 11 is a schematic cross-sectional view of an electronic device of an embodiment of the present disclosure, which adopts the electrical connection structure of FIG. 8. Please refer to both FIG. 11 and FIG. 8, in this embodiment, the electronic device ED includes the electrical connection structure 100 of FIG. 8, one or plural electronic components 122, a third substrate 128, a third conductive pad 124 and a conductive material 126. Wherein, the electrical connection structure 100 includes the first substrate 102, the first conductive pad 104 disposed on the first substrate 102, the second substrate 106, the second conductive pad 108 disposed on the second substrate 106, at least two through holes (i.e., the through hole 110 and through hole 112) and the conductive material 114, and the conductive material 114 electrically connects the first conductive pad 104 and the second conductive pad 108 through being partially disposed in the through hole 110 and through hole 112. The through hole 110 and through hole 112 may have irregular outer sidewall 1101 and 1121, while the inner sidewalls 1102 and 1122 may be inclined sidewalls. In addition, the bottom of the conductive material 114 may have wide parts 1141 and wide parts 1142 near the second conductive pad 108, and the sidewall 1101, sidewall 1102, sidewall 1121 and sidewall 1122 may have concave parts 1103 and concave parts 1123 (shown in FIG. 8, but not shown in FIG. 11) respectively corresponding to the wide parts 1141 and wide parts 1142. The electrical connection structure 100 in the electronic device ED can be used to electrically connect the first conductive pad 104 on the first substrate 102 and the second conductive pad 108 on the second substrate 106 to form a conduction path passing through the first substrate 102 between the first conductive pad 104 and the second conductive pad 108. Furthermore, the third substrate 128 is located at a side of the second substrate 106 opposite to the first substrate 102, the third conductive pad 124 is disposed on the third substrate 128 and is located between the third substrate 128 and the second substrate 106, and the conductive material 126 can electrically connect the second conductive pad 108 and the third conductive pad 124. For example, the second substrate 106 may have a through hole 130, which passes through the second substrate 106 to expose the third conductive pad 124 and the second conductive pad 108, and the conductive material 126 may be disposed in the through hole 130 to directly contact the third conductive pad 124 and the second conductive pad 108, so as to electrically connect the two conductive pads. In this embodiment, the second substrate 106, the second conductive pad 108, the conductive material 126, the third conductive pad 124, the third substrate 128 and/or the through hole 130 constitutes a conduction path passing through the second substrate 106, which may also be regarded as an electrical connection structure 200 of the present disclosure. In other words, the electronic device ED of this embodiment can realize the electrical connection of multiple substrates through the electrical connection structure 100 and the electrical connection structure 200. It should be noted that the electronic device ED of the present disclosure is not limited to the structure shown in FIG. 11. The electrical connection structure 100 and the electrical connection structure 200 may be arbitrarily replaced with any electrical connection structure mentioned in the above specification (i.e., any one of FIG. 1 to FIG. 10) individually. In short, the electronic device ED may have multiple electrical connection structures in some embodiments, wherein the electrical connection structures may be constituted by any electrical connection structure in the above specification or a combination of the above electrical connection structures, and the multiple electrical connection structures may be the same or different, but not limited thereto.

The third substrate 128 may be, for example, a driving substrate, an integrated circuit substrate, or an external circuit board, but not limited to the above. The material of the conductive material 126 may be the same as or different from the conductive material 114. The material of the third conductive pad 124 may be the same as or different from the first conductive pad 104 and the second conductive pad 108. In some embodiments, one or more third conductive pads 124 may be disposed on the third substrate 128. In variant embodiments, the third conductive pads 124 and the conductive material 126 may include the same material or composed of the same conductive layer. In other variant embodiments, the third conductive pads 124, the conductive material 126 and the second conductive pad 108 may include the same material or composed of the same conductive layer, but not limited to the above. In some embodiments, the layer-stacked structure and material of the third substrate 128 may be similar to the aforementioned first substrate 102 and second substrate 106 for example. In some embodiments, another interlayer (not shown) may be included between the third substrate 128 and the second substrate 106, wherein the another interlayer may be the same as or different from the interlayer 118 disposed between the first substrate 102 and the second substrate 106.

According to the present disclosure, one or more electronic components 122 may be disposed on the surface of the first substrate 102. Each electronic component 122 may have conductive pad(s) 1221, which may be electrically connected to the first substrate 102, but not limited thereto. The electronic components 122 may include passive and/or active elements, such as capacitors, resistors, inductors, variable capacitors, filters, diodes, transistors, sensors, micro electro mechanical systems (MEMS), liquid crystal chips, circuit boards, chips, dies, integrated circuits (IC), packaged components or a combination of the above, without limitation. The diodes may include light emitting diodes, photodiodes, variable capacitance diodes, or antenna diodes. The light emitting diodes may include, for example, organic light emitting diodes (OLEDs), sub-millimeter light emitting diodes (mini LEDs), micro light emitting diodes (micro LEDs), quantum dot LEDs (such as QLED, QDLED), fluorescence, phosphor or other suitable materials, or a combination of the above, but not limited thereto. The sensors may, for example, include capacitive sensors, optical sensors, electromagnetic sensors, fingerprint sensors (FPSs), touch sensors, antenna, pen sensors, etc., but not limited thereto this.

The electronic device ED of this embodiment may be bendable, stretchable, foldable, rollable and/or flexible, but not limited thereto. The electronic device ED may include a display device, an antenna device, a sensing device, a light emitting device, a touch device, a touch display devices, a packaging device, a curved displays, a free shape display or a tiled device, but not limited thereto. The electronic device ED may include a bendable or flexible electronic device. The electronic device ED may include a plurality of light boards electrically connected to each other. The display device may be applied to laptop computer, public display, splicing display, car display, touch display, television, monitor, smart phone, tablet computer, light source module, lighting equipment or electronic device such as applied to the above products, but not limited thereto. Display device for example includes liquid crystal layer or light emitting diodes (LEDs). The sensing device may be, for example, a sensing device for detecting variation of capacitance, light, heat or ultrasonic waves, but is not limited thereto. The sensing device may, for example, include biosensors, touch sensors, fingerprint sensors, other suitable sensors or combinations of the above types of sensors. Antenna device may for example be, but not limited to, a liquid crystal antenna or a diode antenna. Antenna device may include, but not limited to, an antenna tiled device. Tiled device may include, for example, tiled display device or tiled antenna device, but not limited thereto. It should be noted that the electronic device ED may be any permutation and combination of the above, but not limited to the above. In addition, the electronic device ED in appearance may have a rectangular shape, a circular shape, polygonal shape, a shape with curved edges or other suitable shapes. The electronic device ED may have peripheral systems such as a driving system, a control system, a light source system, a shelf system, etc., to support the display device, the antenna device or the tiled device.

To sum up, in the embodiments of the present disclosure, at least two through holes of the electrical connection structure pass through the first substrate and expose the second top surface of the second conductive pad, and the conductive material is partially disposed in the two through holes, such that the first substrate and the second substrate can be electrically conducted. Therefore, the electrical connection structure of the present disclosure can achieve the effect of electrically connecting multiple substrates, and when it is subsequently applied to an electronic device, the electrical conduction path(s) between substrates can be greatly shortened. In another aspect, the design of the surrounding region or peripheral region of the substrates may also be simplified, enabling to achieve the electronic device having a design of narrow border or even without border. In addition, the design of at least two through holes enables two or more conduction paths between the substrates, which provide multiple insurances to improve the success rate and performance of electrical connection. Furthermore, the design of the wide parts of the conductive material and the concave parts of the through holes and the inclined sidewalls increases the contact area between the conductive material and the conductive pads, which can further improve the electrical connection effect, so that the electrical connection structure of the present disclosure has better electrical reliability.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electrical connection structure, comprising:
- a first substrate;
- a first conductive pad disposed on the first substrate, wherein the first conductive pad comprises a first top surface;
- a second substrate;
- a second conductive pad disposed on the second substrate, wherein the second conductive pad comprises a second top surface;
- at least two through holes passing through the first substrate and exposing a portion of the second top surface; and
- a conductive material, wherein a portion of the conductive material is disposed within the at least two through holes, and the conductive material electrically connects the first conductive pad and the second conductive pad, wherein in a top view of the electrical connection structure, the conductive material covers at least a portion of the first conductive pad and at least a portion of the at least two through holes.

2. The electrical connection structure according to claim 1, wherein the conductive material electrically connects the first conductive pad and the second conductive pad through directly contacting the first top surface and the second top surface.

3. The electrical connection structure according to claim 1, wherein the conductive material comprises at least two wide parts, each of which is disposed within a respective through hole of the at least two through holes.

4. The electrical connection structure according to claim 3, wherein each of the at least two through holes has a concave part, and each of the concave parts corresponds to a respective one of the at least two wide parts of the conductive material.

5. The electrical connection structure according to claim 4, wherein the concave parts are adjacent to the second conductive pad, and the at least two wide parts are adjacent to the second conductive pad.

6. The electrical connection structure according to claim 1, wherein in the top view of the electrical connection structure, the first conductive pad is disposed between the at least two through holes.

7. The electrical connection structure according to claim 1, wherein the at least two through holes have an irregular sidewall respectively.

8. The electrical connection structure according to claim 1, wherein the at least two through holes have an inclined sidewall respectively.

9. The electrical connection structure according to claim 1, wherein in the top view of the electrical connection structure, the at least two through holes have different shapes.

10. The electrical connection structure according to claim 1, wherein in the top view of the electrical connection structure, the at least two through holes respectively have a rectangular shape or a rectangle-like shape.

11. The electrical connection structure according to claim 1, wherein in the top view of the electrical connection structure, the conductive material completely covers the first conductive pad.

12. The electrical connection structure according to claim 1, wherein the conductive material directly contacts an outer sidewall of each of the at least two through holes.

13. The electrical connection structure according to claim 1, wherein a bottom width in a direction of one of the at least two through holes is greater than a top width in the direction of the one of the at least two through holes.

* * * * *